(12) United States Patent
Kim

(10) Patent No.: US 11,959,971 B2
(45) Date of Patent: Apr. 16, 2024

(54) METHOD AND SYSTEM FOR DETECTING CONNECTION FAULT OF PARALLEL CONNECTION CELL

(71) Applicant: LG ENERGY SOLUTION, LTD., Seoul (KR)

(72) Inventor: Jeong Wan Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 51 days.

(21) Appl. No.: 17/630,807

(22) PCT Filed: Sep. 24, 2020

(86) PCT No.: PCT/KR2020/013013
§ 371 (c)(1),
(2) Date: Jan. 27, 2022

(87) PCT Pub. No.: WO2021/066393
PCT Pub. Date: Apr. 8, 2021

(65) Prior Publication Data
US 2022/0276312 A1    Sep. 1, 2022

(30) Foreign Application Priority Data
Oct. 2, 2019 (KR) .................. 10-2019-0122268

(51) Int. Cl.
*G01R 31/389* (2019.01)
*G01R 31/3835* (2019.01)
(Continued)

(52) U.S. Cl.
CPC ....... *G01R 31/389* (2019.01); *G01R 31/3835* (2019.01); *G01R 31/66* (2020.01);
(Continued)

(58) Field of Classification Search
None
See application file for complete search history.

(56) References Cited

U.S. PATENT DOCUMENTS

| | | | |
|---|---|---|---|
| 8,168,315 B1 * | 5/2012 | Hermann | G01R 31/382 429/93 |
| 10,365,307 B2 | 7/2019 | Park et al. | |

(Continued)

FOREIGN PATENT DOCUMENTS

| | | |
|---|---|---|
| CN | 103109197 A | 5/2013 |
| CN | 107640033 A | 1/2018 |

(Continued)

OTHER PUBLICATIONS

International Search Report for PCT/KR2020/013013 dated Jan. 6, 2021.
(Continued)

*Primary Examiner* — Jas A Sanghera
(74) *Attorney, Agent, or Firm* — Birch, Stewart, Kolasch & Birch, LLP

(57) ABSTRACT

Disclosed is a method and system for detecting connection failure of a parallel connected cell that provides improved accuracy by first detecting the cell connection failure due to the current interruption device (CID) operation of the battery or opening the parallel connection line for a battery that is being discharged by the operation of an external device, and confirming the first detection result through Direct Current Internal Resistance (DCIR) measurement for the battery.

10 Claims, 4 Drawing Sheets

(51) Int. Cl.
G01R 31/66 (2020.01)
H01M 10/44 (2006.01)
H01M 10/48 (2006.01)
H01M 50/512 (2021.01)

(52) U.S. Cl.
CPC ........... *H01M 10/44* (2013.01); *H01M 10/48* (2013.01); *H01M 50/512* (2021.01)

(56) References Cited

U.S. PATENT DOCUMENTS

| | | | | |
|---|---|---|---|---|
| 2011/0148361 | A1* | 6/2011 | Yokotani | B60L 58/21 320/136 |
| 2013/0278218 | A1* | 10/2013 | Onnerud | H02J 7/0016 320/118 |
| 2013/0342212 | A1 | 12/2013 | Kawahira et al. | |
| 2014/0021925 | A1 | 1/2014 | Asakura et al. | |
| 2014/0343876 | A1 | 11/2014 | Takahashi et al. | |

FOREIGN PATENT DOCUMENTS

| | | |
|---|---|---|
| CN | 108848183 A | 10/2018 |
| CN | 108808759 A | 11/2018 |
| CN | 110165740 A | 8/2019 |
| EP | 2 693 592 A1 | 2/2014 |
| JP | 2008-182779 A | 8/2008 |
| JP | 2010-539642 A | 12/2010 |
| JP | 2011-135657 A | 7/2011 |
| JP | 2012-60786 A | 3/2012 |
| JP | 2013-128340 A | 6/2013 |
| JP | 2013-243880 A | 12/2013 |
| JP | 2014-6189 A | 1/2014 |
| JP | 2015-102396 A | 6/2015 |
| JP | 2015-109148 A | 6/2015 |
| JP | 2018-26888 A | 2/2018 |
| JP | 2018-147665 A | 9/2018 |
| JP | 2019-22372 A | 2/2019 |
| KR | 10-0823188 B1 | 4/2008 |
| KR | 10-0885243 B1 | 2/2009 |
| KR | 10-2016-0092711 A | 8/2016 |
| KR | 10-2016-0108963 A | 9/2016 |
| KR | 10-2017-0064608 A | 6/2017 |
| KR | 10-1757969 B1 | 7/2017 |
| KR | 10-1835373 B1 | 3/2018 |
| KR | 10-2005399 B1 | 10/2019 |
| WO | WO 2019/123907 A1 | 6/2019 |

OTHER PUBLICATIONS

Extended European Search Report for European Patent Application No. 20870549.1 dated May 9, 2022.

* cited by examiner

METHOD AND SYSTEM FOR DETECTING CONNECTION FAULT OF PARALLEL CONNECTION CELL

TECHNICAL FIELD

The present invention relates to a method and system for detecting connection failure of a parallel connection cell, and more specifically, to a method and system for detecting connection failure of a parallel connection, which are capable of detecting a disconnection of a specific cell due to an open parallel connection line of a cell or an operation of a protection element such as a CID.

BACKGROUND ART

Unlike primary batteries that cannot be recharged, rechargeable secondary batteries are widely used in various fields ranging from electric bicycles, electric vehicles, and energy storage systems (ESS) as well as small high-tech electronic devices such as smart phones, notebook computers, and tablet PCs.

Because medium and large devices such as electric bicycles, electric vehicles, and energy storage systems (ESS) require high power and large capacity, when the secondary battery is applied to medium and large devices, a plurality of battery cells are directly/parallel connected to use battery packs electrically connected to each other.

In general, battery cells included in battery packs are protection elements to ensure safety during charging and are equipped with a current interruption device (CID) that cuts off when the pressure inside the cell increases to prevent current from flowing through the cell, so that they are configured to safely prevent overcharging of the battery.

However, if the CID of a specific battery cell operates while the battery cells are connected in parallel, since the connection of the corresponding failure battery cell is disconnected, overcurrent flows in the remaining normal battery cells parallel connected with the failure battery cell by the current flowing through the failure battery cell, so that overloading occurs on normal battery cells. In addition, even when disconnection of a specific battery cell occurs among parallel connected battery cells due to a cause such as opening of the parallel connection line of a specific battery cell in addition to the operation of the protection element such as CID as above, overcurrent flows through the remaining normal battery cells.

Such a phenomenon promotes cell deterioration and causes a decrease in battery performance and lifespan, in order to prevent this problem from occurring, there is a need for a technology capable of detecting a cell disconnection due to an open parallel connection line or a CID operation when a plurality of battery cells are connected in parallel. (Patent Document 1) KR10-2017-0064608 A1

DISCLOSURE

Technical Problem

The present invention is to solve the above-described problem, and an object of the present invention is to provide a method of detecting a disconnection due to an open parallel connection line of a specific cell among parallel connected battery cells or a CID operation.

Technical Solution

According to an embodiment of the present invention, a method of detecting connection failure of a parallel connection cell includes: a reference data acquisition step of acquiring reference data when a cell connection failure occurs by generating a current interruption device (CID) operation or a parallel connection line open condition in a battery being discharged; a monitoring step of monitoring actual driving discharge data generated on the battery being discharged by an operation of an external device; a cell connection failure first detection step of comparing, from an actual driving discharge data monitored in the monitoring step, whether there is a section in the actual driving discharge data matching the amount of change in a discharge voltage value due to the CID operation or the open parallel connection line in the reference data and first detecting whether a cell connection failure occurs due to the CID operation or the open parallel connection line in the corresponding battery according to a comparison result; and a cell connection failure final detection step of finally confirming whether a result of the first detection is correct.

Moreover, the method further includes an abnormality notification step of generating and notifying an abnormality signal in response to it being finally confirmed that the battery is in a state in which cell connection failure occurs due to the CID operation or the open parallel connection line in the cell connection failure final detection step.

In more detail, the reference data acquisition step includes: a driving discharge reference data acquisition step of measuring the discharge voltage value at a predetermined periodic interval while discharging a predetermined reference battery connected to the external device through an operation of the external device, and acquiring driving discharge reference data based on the measured discharge voltage value; a connection failure time point reference data acquisition step of acquiring connection failure time point reference data generated accordingly due to the CID operation or the open parallel connection line at a predetermined time point while the driving discharge reference data acquisition step is in progress; a first connection failure reference detection data acquisition step of summing the acquired driving discharge reference data and connection failure time point reference data for a same time interval and first acquiring data on a change in a discharge voltage value in the CID operation or the open area of a parallel connection line; and a final connection failure detection reference data acquisition step of repeating the driving discharge reference data acquisition step, the connection failure time point reference data acquisition step, and the first connection failure detection reference data acquisition step a predetermined number of times and by applying a machine learning technique to the plurality of first connection failure detection reference data obtained and finally acquiring data on the amount of change in the discharge voltage value in the CID operation or the parallel connection line open area.

Moreover, the cell connection failure first detection step includes: a match comparison step of comparing whether the section matching the final connection failure detection reference data acquired in the final connection failure detection reference data acquisition step exists from the actual driving discharge data monitored in the monitoring step; and a connection failure first determination step of determining, from the actual driving discharge data as a result of the match comparison step, the corresponding section as the section in which the amount of change in the discharge voltage value occurs due to the CID operation or the open parallel connection line in response to there being the section matching the final connection failure detection reference data and first determining that the cell connection failure occurs due to the CID operation or the open parallel connection line in the corresponding battery.

In addition, the cell connection failure final detection step includes: a charging current formation step of forming a charging current in the battery first detected as being in a cell connection failure state due to the CID operation or the open parallel connection line in the cell connection failure first detection step; a DCIR measurement step of measuring Direct Current Internal Resistance (DCIR) of the battery while charging current flows through the battery by the charging current formation step; a DCIR comparison step of comparing whether a DCIR value of the battery measured in the DCIR measurement step is out of a predetermined DCIR reference range; and a connection failure final determination step of finally determining that a cell connection failure occurs due to the CID or the open parallel connection line in the corresponding battery when the DCIR value of the battery is out of the predetermined DCIR reference range according to a result of the DCIR comparison step.

Here, the driving discharge reference data is a change amount of the discharge voltage value for the reference battery, wherein the connection failure time point reference data is an amount of change in the discharge voltage value caused by the CID operation or the open parallel connection line with respect to the reference battery.

Moreover, a connection failure detection system of a parallel connection cell includes: one or more batteries including at least one or more cells connected in parallel; a voltage measurer configured to measure a discharge voltage of a battery at predetermined periodic intervals; a monitor configured to monitor actual driving discharge data derived as an analog signal in a waveform form based on the discharge voltage value measured by the voltage measurer; a memory configured to store reference data for detecting whether a cell connection failure occurs due to a current interruption device (CID) operation or an open parallel connection line in the battery; a cell connection failure first detector configured to detect whether there is a section matching the amount of change in the discharge voltage value due to a CID operation or an open parallel connection line of the reference data in the actual driving discharge data monitored by the monitor using the reference data stored in the memory and first detect whether a cell connection failure occurs due to the CID operation or the open parallel connection line in the corresponding battery; and a cell connection failure final detector configured to finally detect whether a cell connection failure due to the CID operation or the open parallel connection line occurs in the corresponding battery by checking whether the result of the first detection as being in a cell connection failure state is correct through the cell connection failure first detector.

Here, the reference data stored in the memory is configured to include final connection failure detection reference data, wherein the final connection failure detection reference data is the amount of change in the discharge voltage value of the battery that occurs when the CID operates or the parallel connection line being opened.

Moreover, the cell connection failure first detector includes: a match comparator configured to compare whether a section matching the final connection failure detection reference data exists among actual driving discharge data of the battery monitored by the monitor; a connection failure first determiner configured to, as a result of the comparison, in response to there being a section matching the final connection failure detection reference data in the actual driving discharge data, first detect this as a section in which the amount of change in the discharge voltage value occurs due to the CID operation or the open parallel connection line open and determine whether a cell connection failure occurs due to the CID operation or the open parallel connection line open in the corresponding battery; and a cell connection failure first detection signal generator configured to, if the connection failure first determiner first determines that the cell connection failure occurs due to the CID operation or the open parallel connection line in the corresponding battery, generate and output a cell connection failure first detection signal indicating this.

Furthermore, the cell connection failure final detector includes: a Direct Current Internal Resistance (DCIR) measurer configured to measure DCIR of the battery in a state in which a charging current flows through the battery corresponding to the cell connection failure first detection signal; a DCIR comparator configured to compare whether the DCIR value measured in the DCIR measurer is out of a predetermined DCIR reference range; and a connection failure final determiner configured to finally determine that a cell connection failure occurs due to a CID operation or an open parallel connection line in the corresponding battery, and generate and output a cell connection failure final detection signal in response to the DCIR value of the battery corresponding to the cell connection failure first detection signal being out of the predetermined DCIR reference range according to a comparison result of the DCIR comparator.

Moreover, the system further includes a notifier configured to generate and output an abnormality signal in response to a cell connection failure detection signal is being outputted from the cell connection failure final determiner.

Here, the actual driving discharge data is the amount of change in the discharge voltage value.

Advantageous Effects

The present invention may first detect a cell connection failure state due to a CID operation or an open parallel connection line in real time for a battery that is being discharged according to an operation of an external device (e.g., a vehicle), and may double check the first detection result through a final confirmation procedure through DCIR measurement of the corresponding battery. Accordingly, it is possible to detect a cell connection failure state due to a CID operation or an open parallel connection line with improved accuracy. Accordingly, it is possible to prevent battery deterioration and performance degradation problems that may be caused by a failure of a specific cell due to a CID operation or an open parallel connection line by coping with the issue.

BEST MODE

Figure 1:
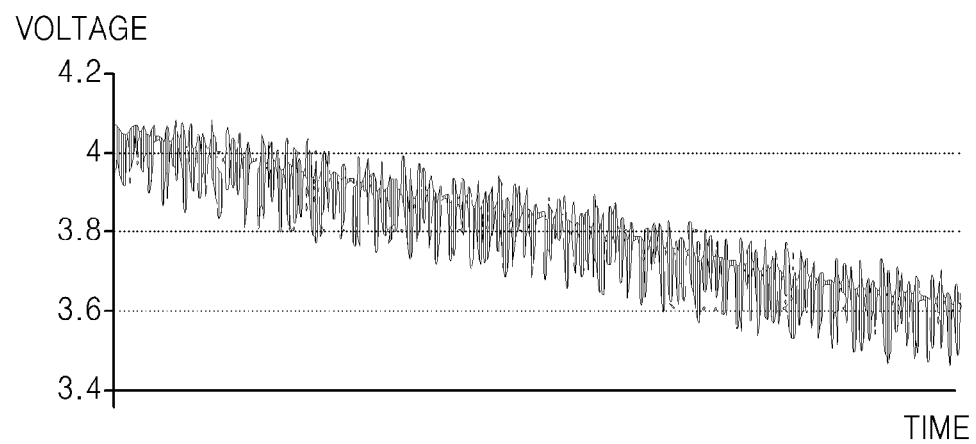
FIG. 1 is a diagram illustrating an example of an analog signal in a waveform form according to a change in a discharge voltage value generated for a battery being discharged according to the operation of a vehicle.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

Hereinafter, the present invention will be described in detail with reference to the drawings.

1. Terms Used in Present Invention

A. Reference Battery/Actual Battery

The battery in the present invention has a structure in which at least one or more cells are connected in parallel, and for example, may be installed and used in any device that uses batteries, including automobiles, scooters, electric kickboards, and energy storage systems (ESS). In this specification, a vehicle battery mounted on a vehicle and supplying power to a power motor will be described as an example.

The reference battery used in the present invention refers to a battery used in an experiment process of acquiring reference data for detecting a CID operation or an open state of a parallel connection line, and the actual battery refers to a battery mounted in an actual vehicle.

These are merely classified terms in order to clearly describe the procedure for convenience of explanation of the procedure of the present invention, and the structure and function thereof are the same.

B. Driving Discharge Reference Data/Connection Failure Time Point Reference Data The driving discharge reference data is an amount of change in a discharge voltage value obtained with respect to a battery being discharged through a predetermined experiment, which means change values in a discharge voltage value represented by an analog signal in a waveform shape as shown in FIG. 1.

Figure 2:
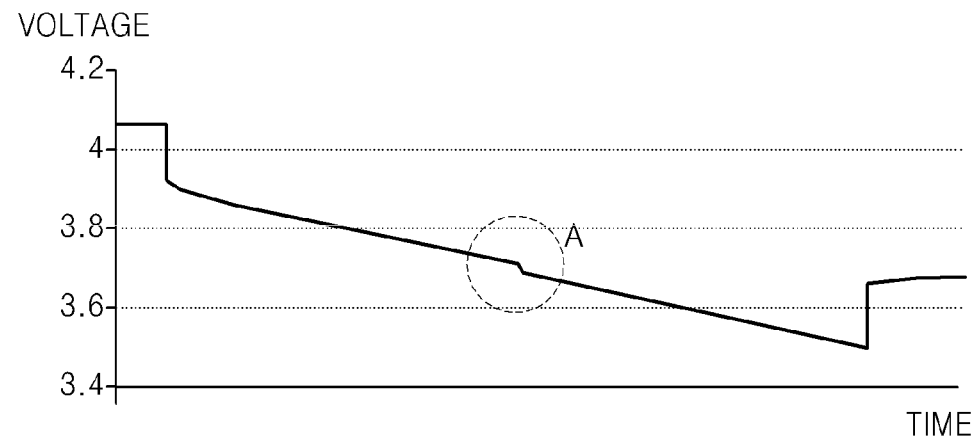
FIG. 2 is a diagram illustrating an example in which the analog signal in the waveform form shown in FIG. 1 is converted into a linear function form.

The connection failure time point reference data is the amount of change in the discharge voltage value that occurs when a CID operation is performed or a parallel connection line is opened, which is acquired through a predetermined experiment, and this refers to the amount of change in the discharge voltage value in the area A, which occurs when the CID operation is performed or the parallel connection line is opened among the change values of the discharge voltage value shown in the form of a linear function as shown in FIG. 2.

C. Actual Driving Discharge Data

The actual driving discharge data is an amount of change in a discharge voltage value obtained with respect to a battery being discharged according to an actual driving of a vehicle, which means change values in the discharge voltage value represented by an analog signal in a waveform shape as shown in FIG. 1.

The driving discharge reference data and the actual driving discharge data described above are terms to distinguish the amount of change in the discharge voltage value acquired in the course of a predetermined experiment for preparing reference data from the amount of change in the discharge voltage value acquired according to the actual vehicle operation. These data are derived as, for example, analog signals in the form of a dynamic waveform as shown in FIG. 1.

D. External Device

The external device referred to in the present invention is a device equipped with a power motor and means, for example, a vehicle. However, the present invention is not limited thereto, and the external device may be any device using a battery such as an energy storage system (ESS), a scooter, and an electric kickboard as well as a vehicle.

Figure 4:
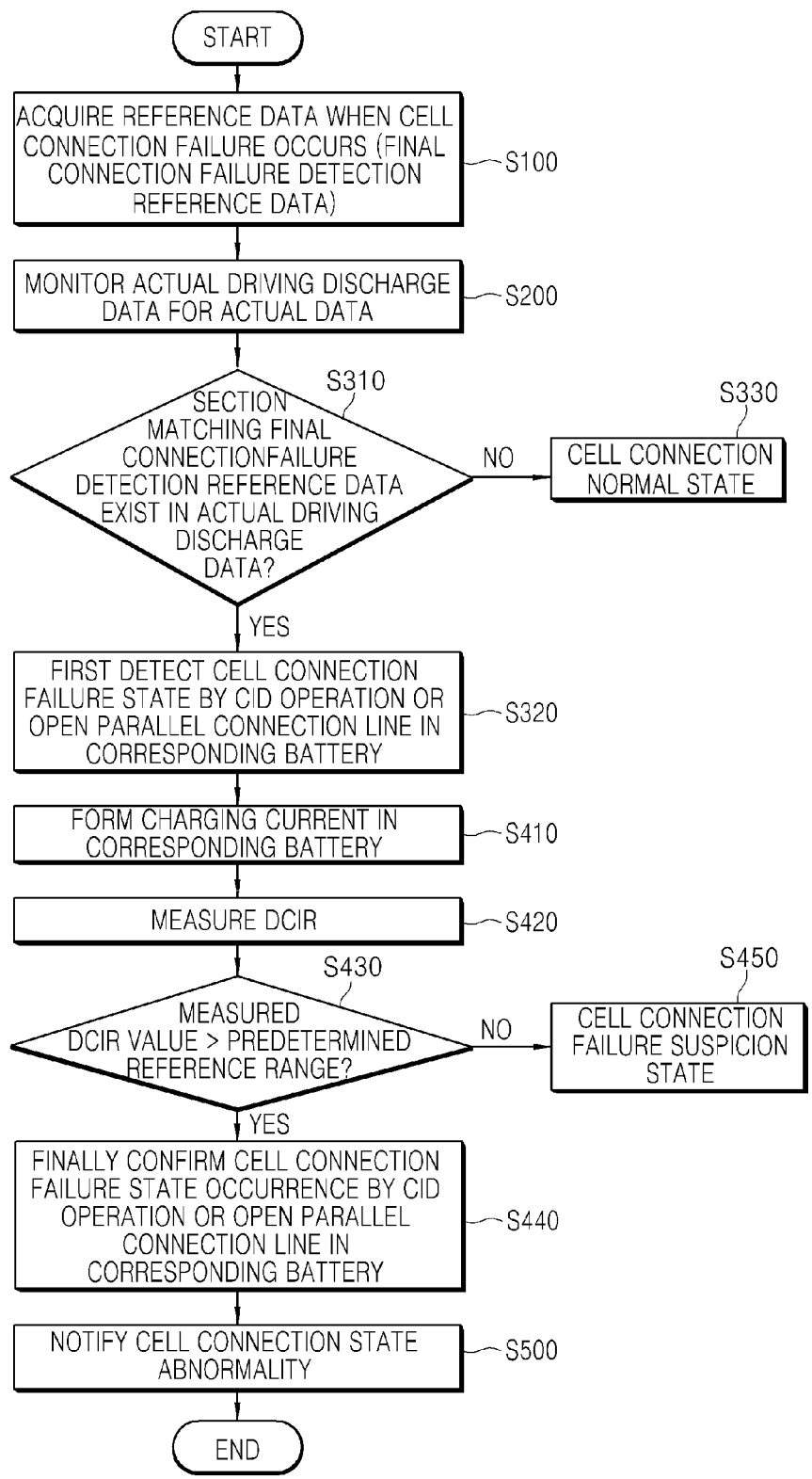
FIG. 4 is a flowchart illustrating a method of detecting connection failure of a parallel connection cell according to the present invention.

2. Method for Detecting Failure of a Parallel Connection Cell According to Present Invention (see FIG. 4)

The method of detecting the failure of a parallel connection cell according to the present invention includes the following steps.

2.1. Reference Data Acquisition Step (S100)

The reference data acquisition step is a step of acquiring reference data when a cell connection failure occurs by generating a CID operation or a parallel connection line open situation in a battery being discharged, and may include the following detailed steps.

A. Driving Discharge Reference Data Acquisition Step (S110)

This is a step of acquiring driving discharge reference data of the reference battery, that is, a change in the discharge voltage value, generated according to the operation while the external device is arbitrarily operated while a predetermined reference battery is mounted on the external device.

As described above, the battery in the present invention is, for example, a vehicle battery mounted on a vehicle to supply power to a power motor, and the external device may mean a vehicle having a power motor. In the case of a vehicle battery, discharging is a state in which power is supplied to the electric motor of the vehicle, and this dynamically changes the degree of power supplied from the battery to the electric motor according to the style of stepping on the vehicle's accelerator, so that as shown in FIG. 1, the discharge voltage value is derived as a decreasing waveform with various widths of change.

In other words, the driving discharge reference data acquisition step is to acquire the amount of change in the discharge voltage value derived as an analog signal in the form of a waveform as shown in FIG. 1, and for this, by discharging a reference battery composed of parallel connected cells while mounted on an external device and measuring the discharge voltage at predetermined periodic intervals, driving discharge reference data as a change amount over time may be obtained based on the measured discharge voltage values.

B. Connection Failure Time Point Reference Data Acquisition Step (S120)

The connection failure time point reference data acquisition step is a step of acquiring a change in a discharge voltage value that occurs in case of a cell connection failure state by generating a current interruption device (CID) operation or a parallel connection line open situation in any one cell while the driving discharge reference data acquisition step S110 is in progress.

As described above, when the battery is discharged by the operation of an external device (e.g., vehicle), since the degree to which power is supplied to the electric motor varies depending on the style of stepping on the accelerator, the change in the discharge voltage value of the battery may be derived as an analog signal in the form of a waveform as shown in FIG. 1, and if selecting and taking the median or average value of the corresponding discharge voltage for each detailed section for these analog signals, the analog signal in the form of a waveform of FIG. 1 may be converted into a form of a decreasing linear function as shown in FIG. 2. In this state, when the CID of any one cell is operated or a specific parallel connection line is opened so that a cell connection failure state occurs, an area where the amount of change in the discharge voltage value decreases occurs, and the corresponding area is shown in the form of a step as shown in area A of FIG. 2. Here, it is sufficient to describe the detailed section as a time section capable of detecting the CID operation or the open state of the parallel connection line.

Since the discharge voltage values dynamically change in the analog signal in the waveform form as shown in FIG. 1, even if there is an area corresponding to the amount of change as in area A of FIG. 2, it is very difficult to detect whether the change is due to a CID operation or an open parallel connection line but as shown in FIG. 2, in the form of a linear function, area A can be easily distinguished.

By using these points, the connection failure time point reference data acquisition step artificially may operate the CID of any one cell at a predetermined time point or open a specific parallel connection line to make a cell connection failure state, and obtain the amount of change in the discharge voltage value generated according thereto, for example, for a reference battery that is discharging, in order to obtain the amount of change in the discharge voltage value that occurs according to a connection failure due to a CID operation corresponding to area A of FIG. 2 or an open parallel connection line. The connection failure time point obtained as described above, that is, the amount of change in the discharge voltage value corresponding to area A of FIG. 2, may be referred to as connection failure time point reference data.

C. First Connection Failure Detection Reference Data Acquisition Step (S130)

In the first connection failure detection reference data acquisition step, the driving discharge reference data acquired in the driving discharge reference data acquisition step S110 and the connection failure time point reference data acquired in the connection failure time point reference data acquisition step S120 are summed for the same time interval, and thus, in the amount of change in the discharge voltage value that occurs according to the actual vehicle operation derived from the analog signal in the waveform form shown in FIG. 1, data capable of detecting whether a change in a discharge voltage value occurs due to a CID operation or a parallel connection line open may be obtained first.

Figure 3:
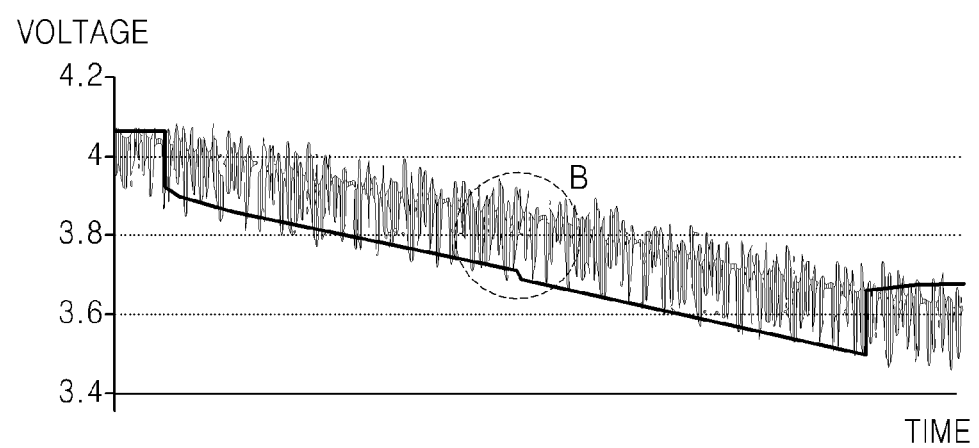
FIG. 3 is a diagram schematically showing a principle of acquiring reference data capable of detecting a CID operation or an open state of a parallel connection line from an analog signal in a waveform form.

In other words, by summing the data for area A shown in FIG. 2 to the analog signal in the waveform form of FIG. 1 for the same time period, through this, the amount of change in the discharge voltage value corresponding to area B shown in FIG. 3 is first obtained.

As described above, the first data obtained for area B may be referred to as first connection failure time point reference data and described.

D. Final Connection Failure Detection Reference Data Acquisition Step (S140)

The final connection failure detection reference data acquisition step may acquire a plurality of first connection failure time point reference data, which is the amount of change in the discharge voltage value corresponding to area B of FIG. 3, by repeating the above-described driving discharge data acquisition step S110, connection failure time point reference data acquisition step S120, and first connection failure detection reference data acquisition step S130 a plurality of times, and finally obtain data (final connection failure reference data) on the amount of change in the discharge voltage value corresponding to area B of FIG. 3 by applying a machine learning technique to the obtained plurality of first connection failure time point reference data.

On the other hand, since the discharge voltage value of the battery generated according to the actual operation of the vehicle is different because the driving style is different for each user (driver), the range of the amount of change in the discharge voltage value generated accordingly will be very diverse. Thus, even if the change of the discharge voltage value is derived from various examples according to various driving styles, in order to detect the amount of change in the discharge voltage value caused by connection failure due to a CID operation or an open parallel connection line, by repeating S110 to S130 to acquire a number of data according to various cases and applying machine learning techniques to derive reference values for a large number of data, this is done by learning the amount of change in area B of FIG. 3 to obtain final connection failure detection data, so that during an actual vehicle operation, a battery in which a cell connection failure due to a CID operation or an open parallel connection line among batteries mounted therein can be detected in real time.

The final connection failure detection reference data obtained as described above is used as reference data that is stored in the memory unit 400 to be described later to enable real-time detection of whether a connection failure occurs due to a CID operation or an open parallel connection line.

2.2. Monitoring Step (S200)

The monitoring step is a step of measuring a discharge voltage value according to an operation of the external device at predetermined periodic intervals for a battery mounted on an external device (e.g., vehicle) and being discharged according to an operation of the external device, and monitoring a change amount based on the measured discharge voltage value.

That is, the amount of change in the discharge voltage value derived from the analog signal in the waveform form as shown in FIG. 1 is monitored, and the amount of change in the discharge voltage value is referred to as actual driving discharge data.

This step is performed by a monitoring unit 300 to be described later.

2.3. Cell Connection Failure First Detection Step (S300)

The cell connection failure first detection step is a step of detecting in real time whether a change in the discharge voltage value corresponding to the cell connection failure state (final connection failure detection data) occurs by a CID operation or an open parallel connection line acquired in the final connection failure reference data acquisition step S140 to first detect a cell connection failure state by the CID operation or the open parallel connection line, from the actual driving discharge data derived as an analog signal in the form of a waveform monitored in the monitoring step S200, and may be configured to include the following detailed steps. (cell connection failure first detection unit 500)

A. Match Comparison Step (S310)

The match comparison step is a step of comparing whether there is a section matching the final connection failure detection reference data acquired in the final connection failure detection reference data acquisition step S140 of the reference data acquisition step S100 from the actual driving discharge data monitored in the monitoring step S200.

That is, in the actual battery being discharged according to the operation of an external device (e.g., vehicle), the form in which the discharge voltage value changes is derived as an analog signal in the form of a waveform as shown in FIG. 1, and it is compared whether there is a section matching the amount of change in the discharge voltage value in area B of FIG. 3 corresponding to the final connection failure detection reference data in the waveforms having various widths of change. This step is performed by the match comparison unit 510 described later.

B. Connection Failure First Determination Step (S320)

As a result of that comparison, in the actual driving discharge data that occurs for the actual battery currently being discharged, when there is a section matching the final connection failure detection reference data, the corresponding section is determined as the section in which the amount of change in the discharge voltage value decreases due to the CID operation of at least one cell of the actual battery or the opening of the parallel connection line, so that a cell connection failure first detection signal for the actual battery may be generated and outputted.

That is, in a state in which the discharge voltage value dynamically changes in the form of a waveform as shown in FIG. 1, when a section matching the amount of change in the discharge voltage value corresponding to area B of FIG. 3 is detected, the corresponding section is determined as a section in which the amount of change in the discharge voltage value decreases due to the operation of the CID of at least one cell of the actual battery or the opening of a specific parallel connection line to generate and output a cell connection failure first detection signal for the actual battery indicating this determination. This step is performed by a connection failure first determination unit 520 and a cell connection failure first detection signal generation unit 530 described later.

Embodiment 1: When Detecting Battery Bank

Here, the cell connection failure first detection signal may include a bank identification number for identifying a battery bank to which a corresponding actual battery belongs. At this time, the battery bank is a group of cells composed of a plurality of actual batteries, and a battery bank including an actual battery in which a CID operates or a parallel connection line is opened may be detected using the bank identification number included in the cell connection failure first detection signal.

Embodiment 2: When Detecting Battery Cell

As another embodiment, the cell connection failure first detection signal may include a battery identification number to identify a corresponding actual battery.

On the other hand, if there is no section in the actual driving discharge data matching the final connection failure detection reference data, the corresponding battery may determine that the cell connection is in a normal state in which the cell connection failure state due to the CID operation or the open parallel connection line open does not occur (S330).

2.4. Cell Connection Failure Final Detection Step (S400)

The cell connection failure final detection step is a step of checking whether the first detection result is correct, and finally detecting whether a corresponding battery is in a cell connection failure state due to a CID operation or a open parallel connection line, for a battery that is first detected as a cell connection failure state due to a CID operation or an open parallel connection line open in the cell connection failure first detection step S300 and it may be configured to include the following detailed steps. (cell connection failure detection unit 600)

A. Charging Current Formation Step (S410)

This is a step of forming a charging current in a measured battery first detected as being in a cell connection failure state due to a CID operation or an open parallel connection line in the cell connection failure first detection step S300, and this may, for example, pass a charging current to the battery through the connection of an external charger or a power generation circuit (not shown) of a vehicle to form a charging current in the measured battery first detected as a cell connection failure state.

B. DCIR Measurement Step (S420)

The DCIR measurement step is a step of measuring the DCIR value of the battery bank including the actual battery in which a CID operation or an open parallel connection line occurs while charging current flows through the battery through the charging current formation step S410.

The Direct Current Internal Resistance (DCIR) is a battery internal resistance value, which can be measured only in an initial state in which a charging current is passed through connection of an external charger or a power generation circuit (not shown) of a vehicle. Therefore, in the initial state of forming a charging current in the battery bank (Embodiment 1) or the actual battery (Embodiment 2) first detected as a cell connection failure state through the charging current formation step S410, it may be configured to measure the DCIR value by performing the DCIR measurement step. The DCIR value measured as described above is used to finally determine whether the result of first detection is correct as the cell connection failure state.

This step is performed by the DCIR measurement unit 610 of the cell connection failure final detection unit 600 to be described later.

C. DCIR Comparison Step (S430)

The DCIR comparison step may compare whether the DCIR value of the actual battery first detected as being in a cell connection failure state measured through the DCIR measurement step S420 is outside a predetermined DCIR reference range.

Embodiment 1: When Detecting Battery Bank

Here, since the cell connection failure first detection signal includes a bank identification number of a battery bank including a battery (cell) in which a connection failure state occurs due to a CID operation or an open parallel connection line, using this, the first detected battery bank is identified as a cell connection failure state, and the DCIR value measured for the battery bank is identified, so that it is possible to compare whether the DCIR value is outside a predetermined DCIR reference range.

Embodiment 2: When Detecting Battery Cell

Here, since the cell connection failure first detection signal includes the battery identification number of the actual battery, by using this, the battery that is first detected as a cell connection failure state is identified, and the DCIR value measured for the battery is identified, it is possible to compare whether the DCIR value is outside a predetermined DCIR reference range.

Such a step is performed by the DCIR comparison unit 620 of the cell connection failure final detection unit 600 to be described later.

D. Connection Failure Final Determination Step (S440)

As a result of the comparison, when the DCIR value of the battery bank (Embodiment 1) or the actual battery is out of a predetermined DCIR reference range, it is determined that the result of the first detection as being in a cell connection failure state for the corresponding battery bank or the actual battery is correct to finally determine a cell connection failure state, and a cell connection failure state final detection signal indicating this can be outputted.

Embodiment 1: When Detecting Battery Bank

Here, the cell connection failure final detection signal may include a bank identification number capable of identifying a corresponding battery bank including an actual battery in which a CID operation or an open parallel connection line occurs.

Embodiment 2: When Detecting Battery Cell

As another example, the cell connection failure final detection signal may include a battery identification number of a corresponding actual battery.

This is achieved by the connection failure final determination unit 640 of the cell connection failure final detection unit 600 to be described later.

Meanwhile, if the DCIR value of the actual battery corresponding to the cell connection failure first detection signal is within a predetermined reference range, the actual battery is not finally determined as a state in which cell connection failure occurs due to a CID operation or an open parallel connection line, but recognized (S450) as a cell connection failure suspicion state so that it can be configured to monitor the battery state with more careful attention.

2.5. Abnormality Notification Step (S500)

In the abnormality notification step, when a cell connection failure final detection signal is outputted in the cell connection failure final detection step S400, an abnormality signal indicating that a cell connection failure occurs due to a CID operation or an open parallel connection line to the corresponding actual battery may be generated and notified. This is performed by the abnormality notification unit/notifier 700.

Accordingly, the user can recognize and respond to an abnormality in the connection state of the battery in real time.

Here, the abnormality signal may include an identification number of a battery bank including a battery in which a cell connection failure occurs due to a CID operation or an open parallel connection line open, or a corresponding battery.

2.6. Cell Connection Failure Final Detection Data Feedback Step (S600)

Data (change amount of the discharge voltage value) on the connection failure state of the cell acquired and determined in the cell connection failure final detection step is fed back to the final connection failure detection reference data acquisition step S140 of the reference data acquisition step S100, so that reference data by machine learning can be enriched and enhanced.

If the above reference data acquisition step S100 is a process of acquiring reference data by artificially generating a cell connection failure state, the data in case of cell connection failure in actual situation is fed back to reference data through this feedback step, so that reference data can be obtained more precisely.

Conventionally, since the analog signal generated while the vehicle battery is discharging is a complex waveform that includes both the discharge voltage values that dynamically change and the discharge voltage values that change accordingly when the CID operates or the parallel connection line is opened, from there, it is difficult to detect the area corresponding to the amount of change in the discharge voltage value due to the CID operation or the open parallel connection line, making it difficult to detect the cell connection failure (disconnection), so that for this reason, there is a problem of promoting cell degeneration. In contrast, the present invention obtains reference data on the amount of change in the discharge voltage value generated when the CID operates or the parallel connection line is opened through the above-described experiment, and by using this, it is possible to detect an area corresponding to the amount of change in the discharge voltage value due to the CID operation or the open parallel connection line from the analog signal in the form of a complex waveform generated during discharge. Accordingly, it is possible to detect in real time a state of cell connection failure occurring with respect to the battery being discharged. Therefore, in order to deal with the above easily, it is possible to prevent battery deterioration and performance degradation problems that may be caused by failure of a specific cell due to CID operation or open parallel connection line.

Figure 5:
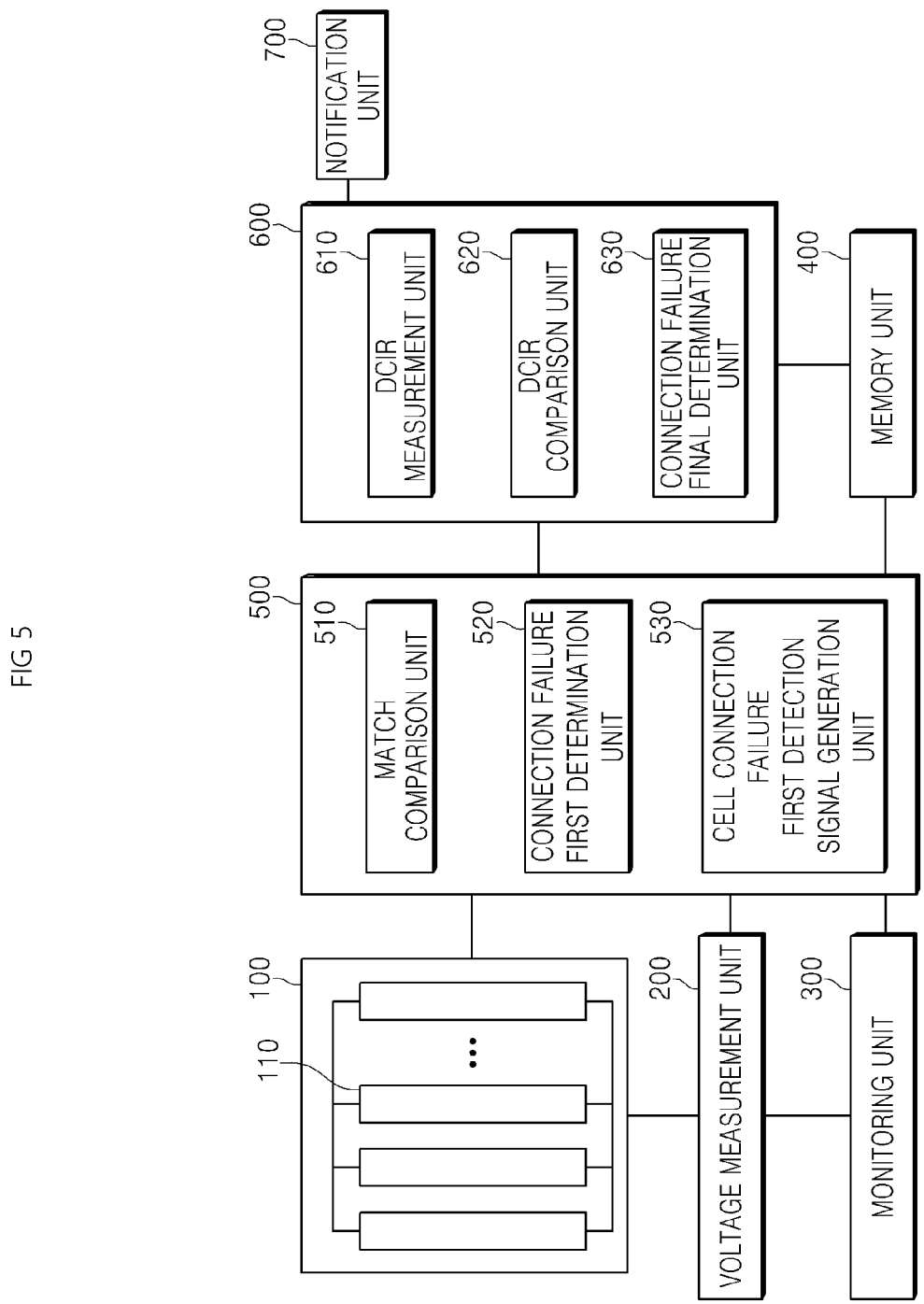
FIG. 5 is a block diagram schematically showing a system for detecting connection failure of a parallel connection cell according to the present invention.

3. Connection Failure Detection System of Parallel Connection Cell according to present invention (see FIG. 5)

3.1. Battery 100

The connection failure detection system of a parallel connection cell according to the present invention may be configured to include one or more batteries configured to include one or more battery cells 110, and the battery cells are connected in parallel, such that electrical connection between the battery cells is made.

The battery may be a battery mounted and used in devices such as a vehicle, an energy storage system (ESS), a scooter, and an electric kickboard, and in this specification, a vehicle battery mounted on a vehicle and supplying power to an electric motor will be described as an example.

3.2. Voltage Measurement Unit 200

The voltage measurement unit is configured to measure a discharge voltage value of the battery at a predetermined periodic interval, and may acquire actual driving discharge data, which is a change in the discharge voltage value of the battery, based on the discharge voltage value measured by the voltage measurement unit.

3.3. Monitoring Unit 300

The monitoring unit is configured to monitor the amount of change in the discharge voltage value of the battery derived as an analog signal in the form of a waveform as shown in FIG. 1 based on the discharge voltage value measured by the voltage measurement unit 200 at a predetermined periodic interval.

In the case of vehicle batteries, the degree of supplying power to the electric motor varies depending on the style of stepping on the accelerator, the amount of change in the discharge voltage value of the battery may be derived as an analog signal in the form of a waveform of FIG. 1, and the monitoring unit monitors the amount of change in the discharge voltage value (actual driving discharge data) in real time.

3.4. Memory Unit 400

This is a component in which reference data is stored to detect a cell connection failure state due to a CID operation or an open parallel connection line obtained through a predetermined experiment.

The reference data includes final connection failure detection reference data as an amount of change in a discharge voltage value caused by a CID operation or an open parallel connection line, and in simple terms, means the amount of change in the discharge voltage value corresponding to area B of FIG. 3.

When explaining the process of obtaining the final connection failure detection reference data stored in the memory unit, first, with a predetermined battery mounted on an external device (e.g., vehicle), while artificially operating the external device, a driving discharge reference data of a battery discharge voltage generated according to the operation is obtained. The battery in the present invention is, for example, a vehicle battery that is mounted on a vehicle and supplies power to a power motor. In the case of a vehicle battery, since discharging is a state in which power is supplied to the electric motor of the vehicle, and this dynamically changes the degree of power supplied from the battery to the electric motor according to the style of stepping on the vehicle's accelerator, as shown in FIG. 1, the discharge voltage value has various widths and is derived as a decreasing waveform.

In the process of acquiring driving discharge data derived in this form, by generating a CID operation or a specific parallel connection line open situation in any one cell, the amount of change (connection failure time point reference data) in the discharge voltage value that occurs in case of cell connection failure is obtained. The reason for doing this process is that as described above, when the battery is discharged according to the operation of the electric vehicle, since the degree to which power is supplied to the electric motor varies depending on the style of stepping on the accelerator, the change in the discharge voltage value of the battery may be derived as an analog signal in the form of a waveform as shown in FIG. 1. If selecting and taking the median or average value of the corresponding discharge voltage for each detailed section for these analog signals, it was confirmed that the analog signal in the form of a waveform of FIG. 1 may be converted into a form of a decreasing linear function as shown in FIG. 2. In addition, In this state, when the CID of any one cell is operated or a specific parallel connection line is opened so that a cell connection failure state occurs, it was confirmed that an area where the amount of change in the discharge voltage value decreases occurs, and the corresponding area is shown in the form of a step as shown in area A of FIG. 2. Since the discharge voltage values dynamically change in the analog signal in the waveform form as shown in FIG. 1, even if the same amount of change as in area A of FIG. 2 occurs, it is very difficult to detect whether the change is due to a CID operation or an open parallel connection line but as shown in FIG. 2, in the form of a linear function, area A is easily distinguished.

By using these points, in order to obtain the amount of change in the discharge voltage value for area A of FIG. 2, for example, for a battery that is being discharged, the CID of any one cell is operated at a predetermined time point or a specific parallel connection line is opened to artificially cause cell connection failure, and the resulting change (connection failure time point reference data) in the discharge voltage value is acquired.

When actual driving discharge data and connection failure time point reference data are obtained through the above-described process, the data is summed over the same time interval, and reference data capable of detecting whether there is a change in a discharge voltage value occurring due to a CID operation or an open parallel connection line may be obtained first from the amount of change in the discharge voltage value derived from the analog signal in the waveform form shown in FIG. 1. In simple terms, the amount of change in the discharge voltage value in area A shown in FIG. 2 is added to the analog signal in the waveform form of FIG. 1 for the same time period, and the amount of change in the discharge voltage value corresponding to area B shown in FIG. 3 is first obtained.

By repeating a number of such processes, a number of data on the amount of change corresponding to area B of FIG. 3 may be obtained, and by applying a machine learning technique to these data and learning about the change in the discharge voltage value due to CID operation or parallel connection line open, final connection failure detection reference data for detecting a change amount for a CID operation or a parallel connection line open time point may be obtained from an analog signal.

Meanwhile, the memory unit may also store DCIR reference range data, which is used as reference data for final determination of whether a result of the first detection of a battery connection failure state is correct.

In addition, the memory unit may receive feedback of final detection data of a battery, which is finally detected as a cell connection failure due to a CID operation or an open parallel connection line from the cell connection failure final detection unit 600 to be described later and reflect the feedback to the reference data and store the reflected data. As described above, since the reference data previously stored in the memory unit is data acquired by artificially generating a cell connection failure state, by receiving feedback of the data (final detection data) from the cell connection failure final detection unit 600 and reflecting the data in the case of a cell connection failure state in an actual situation to reference data, reference data can be obtained more precisely.

3.5. Cell Connection Failure First Detection Unit 500

The cell connection failure first detection unit is configured to detect whether a section matching the amount of change in the discharge voltage value due to the CID operation or the open parallel connection line from the actual driving discharge data monitored by the monitoring unit 300, and first detect a cell connection failure state due to a CID operation of a corresponding battery or an open parallel connection line, and may be configured to include the following detailed configuration.

A. Match Comparison Unit 510

The match comparison unit may compare whether there is a section matching the final connection failure detection reference data stored in the memory unit 400 among actual driving discharge data of the battery monitored by the monitoring unit 300.

In other words, from the amount of change (actual driving discharge data) in the discharge voltage value of the battery currently being discharged derived as an analog signal in the form of a waveform as shown in FIG. 1, this is to compare whether there is a section matching the final connection failure detection reference data that occurs when the CID operates or the parallel connection line is opened.

B. Connection Failure First Determination Unit 520

As a result of the comparison, if there is a section matching the final connection failure reference data in the actual driving discharge data, the corresponding section is detected as the area where the change in the discharge voltage value is decreased due to the CID operation on the battery or the open specific parallel line, it may be determined first that a cell connection failure occurs due to a CID operation or an open parallel connection line in the corresponding battery.

C. Cell Connection Failure First Detection Signal Generation Unit 530

When the connection failure first determination unit 520 first determines that a cell connection failure occurs due to a CID operation or an open specific parallel connection line in the battery, a cell connection failure first detection signal indicating this may be generated and outputted.

In this case, the cell connection failure first detection signal includes data on the amount of change in the discharge voltage value corresponding to a section where it is determined that a cell connection failure occurs due to a CID operation or an open parallel connection line.

In addition, the cell connection failure first detection signal includes a bank identification number or a corresponding battery identification number for identifying a battery bank including a battery (cell) in which a cell connection failure occurs due to a CID operation or an open parallel connection line. Here, the battery bank is a bundle of cells composed of a plurality of batteries, and when the cell connection failure first detection signal includes a bank identification number, it is possible to detect a battery bank including a battery (cell) in which a connection failure state occurs due to a CID operation or an open parallel connection line, and in the case of including the battery's own identification number, it is also possible to detect the battery itself in which a CID operation or an open parallel connection line occurs.

3.6. Cell Connection Failure Final Detection Unit 600

The cell connection failure final detection unit is a component in which the cell connection failure first detection unit 500 rechecks and finally detects a result of first detection for a cell connection failure due to a CID operation or an open parallel connection line, and it may be configured to include the following detailed configuration.

A. DCIR Measurement Unit 610

This allows charging current to flow to the battery through the connection of an external charger or a power generation circuit (not shown) of the vehicle, so that Direct Current Internal Resistance (DCIR) of the battery or the battery bank to which the battery belongs can be measured in the initial state in which the charging current flows in the battery first detected as being a cell connection failure state.

The Direct Current Internal Resistance (DCIR) is a battery internal resistance value, and since it can be measured only in the initial state in which the charging current is passed through the battery, it may be configured to measure a DCIR value in an initial state that forms a charging current in the battery through connection of an external charger or a power generation circuit (not shown) of a vehicle.

The DCIR value measured as described above is used to finally determine whether the result of first detection is correct as the cell connection failure state.

B. DCIR Comparison Unit 620

The DCIR comparison unit may compare whether a DCIR value of a battery or a battery bank first detected as being in a cell connection failure state measured by the DCIR measurement unit 610 is outside a predetermined DCIR reference range.

Embodiment 1: When Detecting Battery Bank

Here, when the cell connection failure first detection signal includes a bank identification number of a battery bank including a battery (cell) in which a connection failure state occurs due to a CID operation or an open parallel connection line, using this, the first detected battery bank is identified as a cell connection failure state, and the DCIR value measured for the battery bank is identified, so that it is possible to compare whether the DCIR value is outside a predetermined DCIR reference range.

Embodiment 2: When Detecting Battery Cell

In another embodiment, when the cell connection failure first detection signal includes the self-identification number of a battery in which a connection failure state occurs due to a CID operation or an open parallel connection line, by using this, the first detected battery is identified as a cell connection failure state, and the DCIR value measured for the battery is identified, so that it is also possible to compare whether the DCIR value is outside a predetermined DCIR reference range.

C. Connection Failure Final Determination Unit 630

As a result of the comparison, when the DCIR value of the battery is out of a predetermined DCIR reference range, it is determined that the result of the first detection as being in a cell connection failure state for the corresponding battery is correct to finally determine a cell connection failure state, and a cell connection failure state final detection signal indicating this may be outputted. Here, the cell connection failure final detection signal may include a battery identification number of a corresponding actual battery or a bank identification number of a battery bank to which the actual battery belongs.

On the other hand, if it is determined as a cell connection failure state, final detection data including data on a change in a discharge voltage value due to a CID operation or an open parallel connection line in the actual discharge data of the corresponding battery is fed back to the memory unit 400, and by reflecting data in the case of a cell connection failure state in an actual situation to the reference data previously stored in the memory unit 400, it can be configured to obtain more sophisticated reference data.

3.7. Notification Unit 700

When a cell connection failure final detection signal is outputted from the connection failure final determination unit 630, the notification unit generates and outputs an abnormality signal including the battery identification number of the corresponding battery or the bank identification number of the battery bank to which the battery belongs, thereby allowing the user to recognize that a cell connection failure state occurs due to CID operation or an open specific parallel line in the battery.

Meanwhile, the voltage measurement unit 200, the monitoring unit 300, the memory unit 400, the cell connection failure first detection unit 500, and the cell connection failure detection unit 600 are a control device or a control unit implementing the cell connection failure detection process described above of the present invention, and may be configured to be integrated into one integrated microprocessor or an engine control electronic control unit (ECU) of the vehicle, and may be configured to be integrated into the battery management device of the vehicle battery pack.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

The invention claimed is:

1. A method of detecting connection failure of a parallel connection cell, the method comprising:

a reference data acquisition step of acquiring reference data when a cell connection failure occurs by generating a current interruption device (CID) operation or a parallel connection line open condition in a battery being discharged;

a monitoring step of monitoring actual driving discharge data generated on the battery being discharged by an operation of an external device;

a cell connection failure first detection step of comparing, from an actual driving discharge data monitored in the monitoring step, whether there is a section in the actual driving discharge data matching the amount of change in a discharge voltage value due to the CID operation or the open parallel connection line in the reference data and first detecting whether a cell connection failure occurs due to the CID operation or the open parallel connection line in the corresponding battery according to a comparison result; and a cell connection failure final detection step of finally confirming whether a result of the first detection is correct, wherein the reference data acquisition step comprises:
  a driving discharge reference data acquisition step of measuring the discharge voltage value at a predetermined periodic interval while discharging a predetermined reference battery connected to the external device through an operation of the external device, and acquiring driving discharge reference data based on the measured discharge voltage value;
  a connection failure time point reference data acquisition step of acquiring connection failure time point reference data generated accordingly due to the CID operation or the open parallel connection line at a predetermined time point while the driving discharge reference data acquisition step is in progress, wherein the driving discharge reference data is a change amount of the discharge voltage value for the reference battery, and wherein the connection failure time point reference data is an amount of change in the discharge voltage value caused by the CID operation or the open parallel connection line with respect to the reference battery.

2. The method of claim 1, further comprising an abnormality notification step of generating and notifying an abnormality signal in response to it being finally confirmed that the battery is in a state in which cell connection failure occurs due to the CID operation or the open parallel connection line in the cell connection failure final detection step.

3. The method of claim 1, wherein the reference data acquisition step further comprises:
  a first connection failure reference detection data acquisition step of summing the acquired driving discharge reference data and connection failure time point reference data for a same time interval and first acquiring data on a change in the discharge voltage value in the CID operation or the open area of a parallel connection line; and
  a final connection failure detection reference data acquisition step of repeating the driving discharge reference data acquisition step, the connection failure time point reference data acquisition step, and the first connection failure detection reference data acquisition step a predetermined number of times and by applying a machine learning technique to the plurality of first connection failure detection reference data obtained and finally acquiring data on the amount of change in the discharge voltage value in the CID operation or the parallel connection line open area.

4. The method of claim 3, wherein the cell connection failure first detection step comprises:
  a match comparison step of comparing whether the section matching the final connection failure detection reference data acquired in the final connection failure detection reference data acquisition step exists from the actual driving discharge data monitored in the monitoring step; and
  a connection failure first determination step of determining, from the actual driving discharge data as a result of the match comparison step, the corresponding section as the section in which the amount of change in the discharge voltage value occurs due to the CID operation or the open parallel connection line in response to there being the section matching the final connection failure detection reference data and first determining that the cell connection failure occurs due to the CID operation or the open parallel connection line in the corresponding battery.

5. The method of claim 4, wherein the cell connection failure final detection step comprises:
  a charging current formation step of forming a charging current in the battery first detected as being in a cell connection failure state due to the CID operation or the open parallel connection line in the cell connection failure first detection step;
  a DCIR measurement step of measuring Direct Current Internal Resistance (DCIR) of the battery while charging current flows through the battery by the charging current formation step;
  a DCIR comparison step of comparing whether a DCIR value of the battery measured in the DCIR measurement step is out of a predetermined DCIR reference range; and
  a connection failure final determination step of finally determining that a cell connection failure occurs due to the CID operation or the open parallel connection line in the corresponding battery when the DCIR value of the battery is out of the predetermined DCIR reference range according to a result of the DCIR comparison step.

6. A connection failure detection system of a parallel connection cell, the system comprising:
  one or more batteries including at least one or more cells connected in parallel;
  a voltage measurer configured to measure a discharge voltage of a battery at predetermined periodic intervals;
  a monitor configured to monitor actual driving discharge data derived as an analog signal in a waveform form based on the discharge voltage value measured by the voltage measurer;
  a memory configured to store reference data for detecting whether a cell connection failure occurs due to a current interruption device (CID) operation or an open parallel connection line in the battery;
  a cell connection failure first detector configured to detect whether there is a section matching the amount of change in the discharge voltage value due to the CID operation or the open parallel connection line of the reference data in the actual driving discharge data monitored by the monitor using the reference data stored in the memory and first detect whether a cell connection failure occurs due to the CID operation or the open parallel connection line in the corresponding battery; and a cell connection failure final detector configured to finally detect whether a cell connection failure due to the CID operation or the open parallel connection line occurs in the corresponding battery by checking whether the result of the first detection as being in a cell connection failure state is correct through the cell connection failure first detector, wherein the reference data stored in the memory is configured to include final connection failure detection reference data, and wherein the final connection failure detection reference data is the amount of change in the discharge voltage value of the battery that occurs when the CID operates or the parallel connection line is opened.

7. The system of claim 6, wherein the cell connection failure first detector comprises:

a match comparator configured to compare whether a section matching the final connection failure detection reference data exists among actual driving discharge data of the battery monitored by the monitor;

a connection failure first determiner configured to, as a result of the comparison, when there is a section matching the final connection failure detection reference data in the actual driving discharge data, first detect this as a section in which the amount of change in the discharge voltage value occurs due to the CID operation or the open parallel connection line open and determine whether a cell connection failure occurs due to the CID operation or the open parallel connection line open in the corresponding battery; and a cell connection failure first detection signal generator configured to, in response to the connection failure first determiner first determining that the cell connection failure occurs due to the CID operation or the open parallel connection line in the corresponding battery, generate and output a cell connection failure first detection signal.

8. The system of claim 7, wherein the cell connection failure final detector comprises:

a Direct Current Internal Resistance (DCIR) measurer configured to measure DCIR of the battery in a state in which a charging current flows through the battery corresponding to the cell connection failure first detection signal;

a DCIR comparator configured to compare whether the DCIR value measured in the DCIR measurer is out of a predetermined DCIR reference range; and a connection failure final determiner configured to finally determine that a cell connection failure occurs due to the CID operation or the open parallel connection line in the corresponding battery, and generate and output a cell connection failure final detection signal in response to the DCIR value of the battery corresponding to the cell connection failure first detection signal being out of the predetermined DCIR reference range according to a comparison result of the DCIR comparator.

9. The system of claim 8, further comprising a notifier configured to generate and output an abnormality signal when a cell connection failure detection signal is outputted from the cell connection failure final determiner.

10. The system of claim 6, wherein the actual driving discharge data is the amount of change in the discharge voltage value.

* * * * *